(12) United States Patent
Jo et al.

(10) Patent No.: US 11,515,898 B2
(45) Date of Patent: Nov. 29, 2022

(54) ERROR CORRECTION DECODER, ERROR CORRECTION CIRCUIT HAVING THE SAME, AND METHOD OF OPERATING THE SAME

(71) Applicant: SK hynix Inc., Gyeonggi-do (KR)

(72) Inventors: Myung Jin Jo, Gyeonggi-do (KR); Soon Young Kang, Gyeonggi-do (KR); Wan Je Sung, Gyeonggi-do (KR); Bo Seok Jeong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 38 days.

(21) Appl. No.: 17/066,618

(22) Filed: Oct. 9, 2020

(65) Prior Publication Data

US 2021/0359710 A1 Nov. 18, 2021

(30) Foreign Application Priority Data

May 12, 2020 (KR) ......................... 10-2020-0056657

(51) Int. Cl.
*H03M 13/00* (2006.01)
*H03M 13/37* (2006.01)
(Continued)

(52) U.S. Cl.
CPC .......... *H03M 13/3746* (2013.01); *G06F 1/04* (2013.01); *H03M 13/1575* (2013.01); *H03M 13/616* (2013.01)

(58) Field of Classification Search
CPC ......... H03M 13/3746; H03M 13/1575; H03M 13/616
See application file for complete search history.

(56) References Cited

U.S. PATENT DOCUMENTS 8,347,195 B1 * 1/2013 Varnica ............. H03M 13/6331
714/752
8,429,498 B1 4/2013 Anholt et al.
(Continued)

FOREIGN PATENT DOCUMENTS

KR 10-1678917 11/2016

OTHER PUBLICATIONS

Office Action for the Chinese Patent Application No. 202110194285.7 issued by the Chinese Patent Office dated Jul. 28, 2022.

*Primary Examiner* — Esaw T Abraham
(74) *Attorney, Agent, or Firm* — IP & T Group LLP

(57) ABSTRACT

Provided herein may be an error correction decoder, an error correction circuit having the error correction decoder, and a method of operating the error correction decoder. The error correction decoder may include a calculator configured to output an error correction message by performing an iterative decoding operation on a first codeword, a syndrome generator configured to generate a syndrome by calculating the error correction message and a parity check matrix and to output a number of iterations representing the number of times the iterative decoding operation has been performed, and an unsatisfied check node (UCN) value representing the number of unsatisfied check nodes in the syndrome, and a speed selector configured to output a speed code for controlling a speed of the iterative decoding operation depending on the number of iterations and the UCN value.

20 Claims, 12 Drawing Sheets

(51) Int. Cl.
*G06F 1/04* (2006.01)
*H03M 13/15* (2006.01)

(56) References Cited

U.S. PATENT DOCUMENTS

| | | | |
|---|---|---|---|
| 9,454,414 B2* | 9/2016 | Micheloni | G06F 11/00 |
| 9,768,807 B2* | 9/2017 | Zhang | H03M 13/658 |
| 9,811,418 B2* | 11/2017 | Sharon | G06F 11/1076 |
| 10,193,569 B2 | 1/2019 | Tseng et al. | |
| 10,447,301 B2* | 10/2019 | Hanham | H03M 13/2906 |
| 10,789,127 B2* | 9/2020 | Yu | H03M 13/3972 |
| 2017/0294217 A1 | 10/2017 | Lin et al. | |

* cited by examiner $$H = \begin{bmatrix} 1 & 0 & 1 & 0 & 1 & 0 & 0 \\ 0 & 1 & 0 & 1 & 0 & 1 & 0 \\ 1 & 0 & 0 & 1 & 0 & 0 & 1 \end{bmatrix}$$

FIG. 10

$$\underbrace{\begin{bmatrix} 1 & 0 & 1 & 0 & 1 & 0 & 0 \\ 0 & 1 & 0 & 1 & 0 & 1 & 0 \\ 1 & 0 & 0 & 1 & 0 & 0 & 1 \end{bmatrix}}_{H} \times \underbrace{\begin{bmatrix} C_{i1} \\ C_{i2} \\ C_{i3} \\ \vdots \\ C_{i7} \end{bmatrix}}_{C_i^T} = \underbrace{\begin{bmatrix} S_{i1} \\ S_{i2} \\ S_{i3} \end{bmatrix}}_{SDR}$$

$C_i^T \downarrow$ MSG ← pass

FIG. 11

| $S_{i1}$ | $S_{i2}$ | $S_{i3}$ | |
|---|---|---|---|
| 0 | 0 | 0 | ← pass |
| UCN — (1) | 0 | 0 | ← fail (UCN#=1) |
| UCN — (1) | 0 | (1) | ← fail (UCN#=2) |

UCN

ERROR CORRECTION DECODER, ERROR CORRECTION CIRCUIT HAVING THE SAME, AND METHOD OF OPERATING THE SAME

CROSS-REFERENCE TO RELATED APPLICATION

The present application claims priority under 35 U.S.C. § 119(a) to Korean patent application number 10-2020-0056657, filed on May 12, 2020, which is incorporated herein by reference in its entirety.

BACKGROUND

Field of Invention

Various embodiments of the present disclosure generally relate to an error correction decoder, an error correction circuit having the error correction decoder, and a method of operating the error correction decoder, and more particularly to an error correction decoder, an error correction circuit having the error correction decoder, and a method of operating the error correction decoder, which improve the operating speed of the error correction decoder.

Description of Related Art

A memory system may include a memory device which can store data, and a controller which can control the memory device in response to a request from a host. For example, the controller may program data provided from the host to the memory device, and may read data stored in the memory device and output the read data to the host. The controller may include an error correction circuit to improve the reliability of data. The error correction circuit may perform encoding and decoding using an error correction code. For example, the error correction code may include an error correction encoder which encodes data provided from the host, and an error correction decoder which decodes data read from the memory device. The data provided from the host may be a message, and the data read from the memory device may be a codeword.

The error correction circuit may convert a codeword into a message by performing a complicated calculation using a low-density parity check (LDPC) code or the like. Recently, as the size of a codeword gradually increases, the time it takes for error correction decoding increases. Due thereto, the time taken by the controller to output read data may also increase. Since a complicated calculation is performed during decoding especially using the LDPC code, the time it takes for the error correction operation may increase.

SUMMARY

Various embodiments of the present disclosure are directed to an error correction decoder that can control the speed of an error correction decoding operation, an error correction circuit having the error correction decoder, and a method of operating the error correction decoder.

An embodiment of the present disclosure may provide for an error correction decoder. The error correction decoder may include a calculator configured to output an error correction message by performing an iterative decoding operation on a first codeword, a syndrome generator configured to generate a syndrome by calculating the error correction message and a parity check matrix and to output a number of iterations representing the number of times the iterative decoding operation has been performed, and an unsatisfied check node (UCN) value representing the number of unsatisfied check nodes in the syndrome, and a speed selector configured to output a speed code for controlling a speed of the iterative decoding operation depending on the number of iterations and the UCN value, wherein the calculator changes the speed of the iterative decoding operation based on the speed code and performs the iterative decoding operation at the changed speed when a second codeword is input.

An embodiment of the present disclosure may provide for an error correction circuit. The error correction circuit may include an error correction encoder configured to generate a codeword by encoding a message received from a host, and transmit the codeword to a memory device, and an error correction decoder configured to receive the codeword from the memory device and output the message by performing a decoding operation on the codeword, and to control a speed of the decoding operation on a subsequent codeword based on a result of the decoding operation on a previous codeword.

An embodiment of the present disclosure may provide for a method of operating an error correction decoder. The method may include outputting an error correction message by performing an iterative decoding operation using a first codeword and a parity check matrix, generating a syndrome by calculating the error correction message and the parity check matrix, checking whether an unsatisfied check node (UCN) is present in the syndrome, when UCN is present in the syndrome, counting the number of UCNs to generate a UCN value and counting the number of iterations corresponding to the number of times that the iterative decoding operation has been performed, changing a speed of the iterative decoding operation depending on the counted UCN value and the counted number of iterations, when no UCN is present in the syndrome, outputting, as a message, values of a transposed matrix used to generate the syndrome, and performing the iterative decoding operation using a second codeword and the parity check matrix at the changed speed.

An embodiment of the present disclosure may provide for a method of operating a low density parity check (LDPC) decoder. The method may include iterating a LDPC decoding operation on a current codeword by changing a variable node, until the operation results in no unsatisfied check nodes (UCNs), and counting the number of iterations and the number of UCNs after each iteration, the operation being performed with a particular number of variable nodes at a particular clock speed, and adjusting, based on at least one of the counted number of iterations and the counted number of UCNs, at least one of the number of variable nodes and the clock speed for performing the LDPC decoding operation on a subsequent codeword.

BRIEF DESCRIPTION OF THE DRAWINGS

FIG. 10 is a diagram illustrating a method of generating a symbol using the parity check matrix illustrated in FIG. 8.

FIG. 11 is a diagram illustrating symbols and unsatisfied check nodes (UCN) according to an embodiment of the present disclosure.

DETAILED DESCRIPTION

Figure 1:
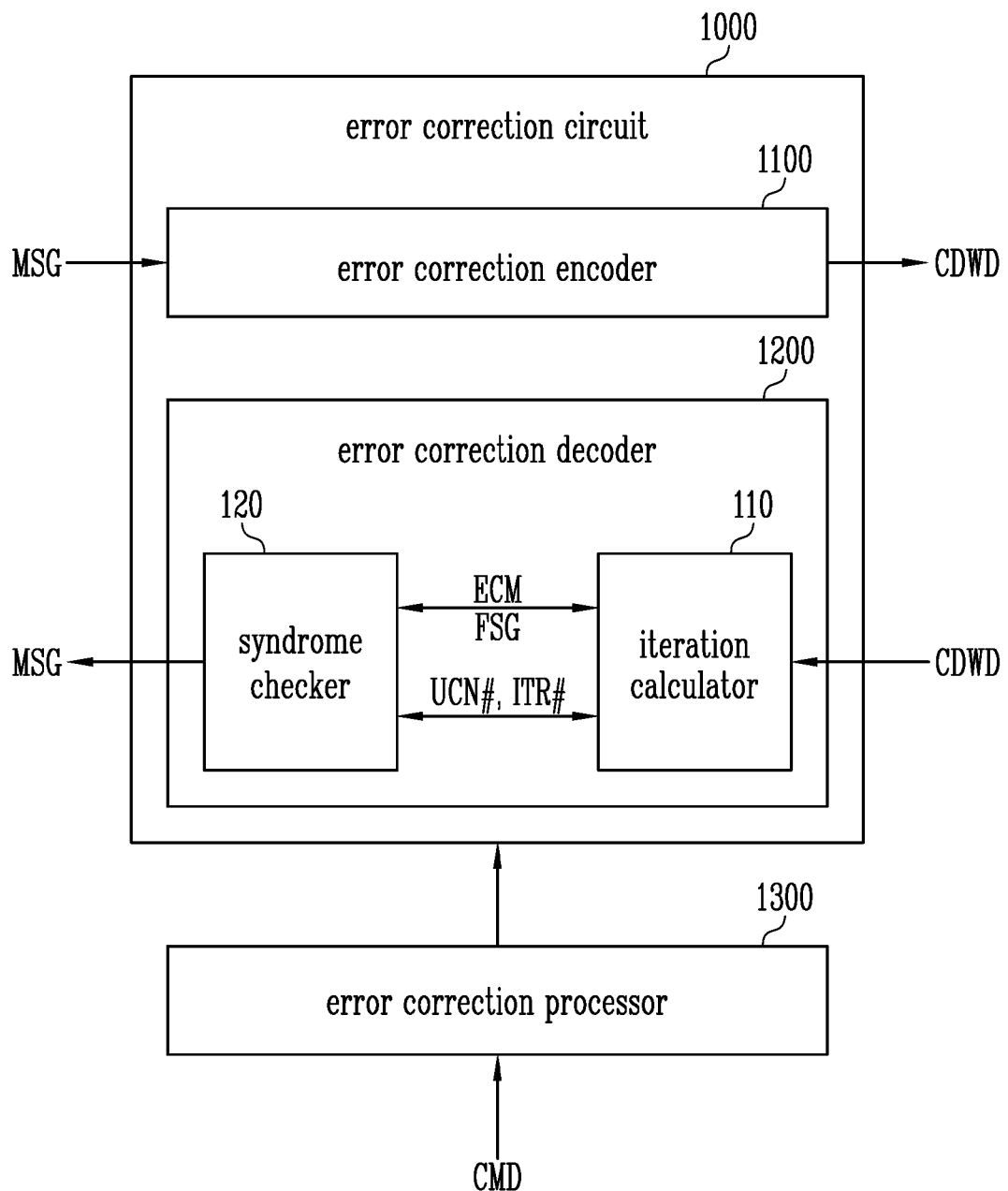
FIG. 1 is a diagram illustrating an error correction circuit according to an embodiment of the present disclosure.

FIG. 1 is a diagram illustrating an error correction circuit according to an embodiment of the present disclosure.

Referring to FIG. 1, an error correction circuit 1000 may output a codeword CDWD by encoding a message MSG output from a host, and may output a message MSG by decoding a codeword CDWD output from a memory device.

The error correction circuit 1000 may convert the message MSG into the codeword CDWD by performing an error correction encoding operation during a program operation, and may convert the codeword CDWD into the message MSG by performing an error correction decoding operation during a read operation.

The error correction circuit 10000 may include an error correction encoder 1100 which may perform an error correction encoding operation, an error correction decoder 1200 which may perform an error correction decoding operation, and an error correction processor 1300 which may control the error correction encoder 1100 and the error correction decoder 1200.

The error correction encoder 1100 may receive a message MSG that is the target of error correction encoding, and may then perform an error correction encoding operation using the received message MSG and a matrix of an error correction code (ECC). In accordance with an embodiment, the error correction encoder 1100 may also perform error correction encoding using a parity check matrix of the error correction code. The error correction encoder 1100 may output a codeword CDWD generated as the result of performing error correction encoding. The codeword CDWD may be transmitted to the memory device through a channel, and may be stored in a plurality of memory cells (e.g., memory cells constituting a single page) included in the memory device. The error correction encoder 1100 may be a low-density parity check (LDPC) encoder that uses an LDPC code as the error correction code.

The error correction decoder 1200 may perform an error correction decoding operation using various algorithms which adopt an iterative decoding scheme. For example, the error correction decoder 1200 may perform an error correction decoding operation using a message passing algorithm that is also referred to as a "belief propagation algorithm". The error correction decoder 1200 may perform a plurality of error correction decoding operations and syndrome check operations within the set maximum number of iterations (i.e., the maximum iteration number), and may output a message MSG when the corresponding error correction decoding operation and the syndrome check operation have passed.

The error correction decoder 1200 may include an iteration calculator 110 and a syndrome checker 120. The iteration calculator 110 may iterate error correction operations using a parity check matrix on the codeword CDWD, and may then output an error correction message (ECM). For example, the iteration calculator 110 may generate a parity check matrix using the codeword CDWD, and may output an error correction message ECM by performing error correction operations corresponding to one cycle.

The syndrome checker 120 may generate a syndrome by performing a decoding operation that uses the error correction message ECM and the parity check matrix, and may determine, based on the syndrome, whether the decoding operation has passed or failed. For example, when an unsatisfied check node (UCN) is included in the syndrome, the syndrome checker 120 may determine that the decoding operation has failed, whereas when no UCN is present in the syndrome, the syndrome checker 120 may determine that the decoding operation has passed.

When it is determined that the decoding operation has failed, the syndrome checker 120 may output a fail signal FSG to the iteration calculator 110. The iteration calculator 110 may output an error correction message ECM by performing a calculation operation corresponding to a next cycle in response to the fail signal FSG. In this way, until the decoding operation passes within the maximum iteration number, the iteration calculator 110 and the syndrome checker 120 may iterate the calculation or the decoding operation.

When it is determined that the decoding operation has passed, the syndrome checker 120 may transmit a UCN value or a number of UCNs UCN # and a number of iterations (i.e., the iteration number) ITR #, which are detected during the iterations of the decoding operation, to the iteration calculator 110.

The iteration calculator 110 may control the speed of calculation of a codeword CDWD to be subsequently input either based on the UCN value UCN # or the number of iterations ITR # or based on the UCN value UCN # and the number of iterations ITR #. For example, the iteration calculator 110 may control the calculation speed so that the calculation speed becomes lower than a previous speed or a reference speed of the decoding operation when either or both of the UCN value UCN # and the number of iterations ITR # are increased from a previous value or a reference value. The iteration calculator 110 may control the calculation speed so that the calculation speed becomes higher than the previous speed or the reference speed when either or both of the UCN value UCN # and the number of iterations ITR # are decreased from the previous value or the reference value. The iteration calculator 110 may maintain the calculation speed at the previous speed or the reference speed when either or both of the UCN value UCN # and the number of iterations ITR # are equal to the previous value or the reference value.

In this way, the present embodiment may control the speed of an error correction calculation on a codeword to be subsequently input based on the result of an error correction calculation on the previously input codeword. Accordingly, when the number of error bits is small, the calculation speed may be adjusted to be higher, thus enabling the performance of the error correction decoder 1200 to be improved. In contrast, when the number of error bits is large, the calculation speed may be adjusted to be lower, thus reducing power consumed by the error correction decoder 1200 while improving the reliability of error correction.

The error correction processor 1300 may control the error correction circuit 1000 in response to a command CMD. For example, the error correction processor 1300 may activate the error correction encoder 1100 in response to a command CMD corresponding to a program operation, and may activate the error correction decoder 1200 in response to a command CMD corresponding to a read operation. Further, the error correction processor 1300 may also control the iteration calculator 110 and the syndrome checker 120 included in the error correction decoder 1200. For this operation, the error correction processor 1300 may store algorithms for controlling the error correction circuit 1000.

Figure 2:
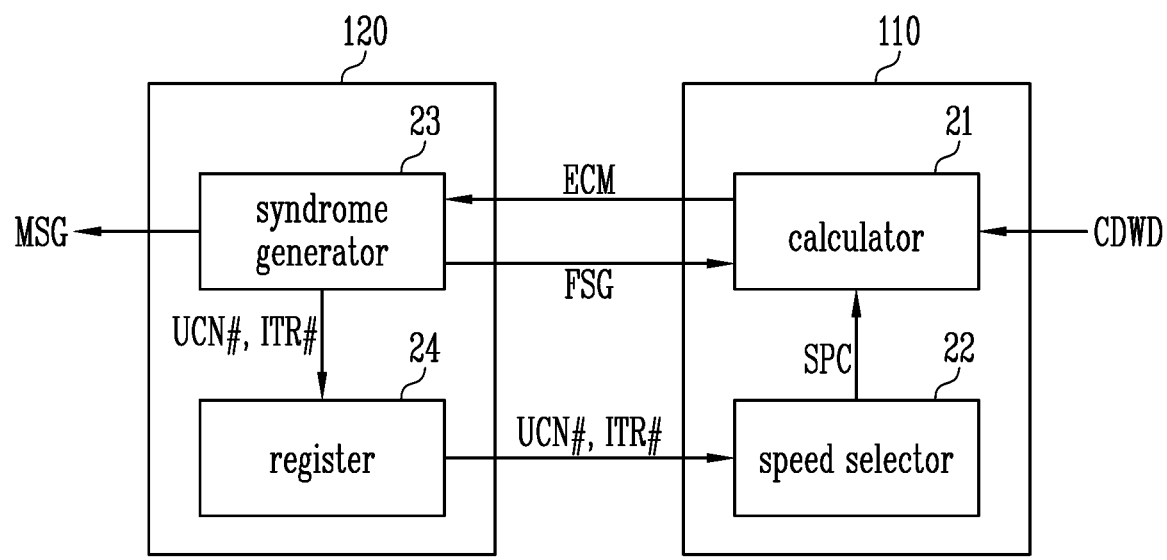
FIG. 2 is a diagram illustrating an iteration calculator and a syndrome checker according to an embodiment of the present disclosure.

FIG. 2 is a diagram illustrating an iteration calculator and a syndrome checker according to an embodiment of the present disclosure.

Referring to FIG. 2, the iteration calculator 110 may include a calculator 21 and a speed selector 22, and the syndrome checker 120 may include a syndrome generator 23 and a register 24.

The calculator 21 may generate an error correction message ECM by performing a calculation operation using a parity check matrix when a codeword CDWD is input, and may output the generated error correction message ECM to the syndrome generator 23. When a fail signal FSG is output from the syndrome generator 23, the calculator 21 may perform subsequent error correction operations in response to the fail signal FSG, and may then generate and output an error correction message ECM different from the previous error correction message.

The speed selector 22 may output different speed codes SPC depending on either or both of a UCN value UCN # and the number of iterations ITR #. For example, the speed selector 22 may output a speed code SPC for controlling the calculation speed so that the calculation speed becomes lower than a previous speed or a reference speed when either or both of the UCN value UCN # and the number of iterations ITR # are increased from a previous value or a reference value. The speed selector 22 may output a speed code SPC for controlling the calculation speed so that the calculation speed becomes higher than the previous speed or the reference speed when either or both of the UCN value UCN # and the number of iterations ITR # are decreased from the previous value or the reference value. The speed selector 22 may output a speed code SPC for maintaining the calculation speed at the previous speed or the reference speed when either or both of the UCN value UCN # and the number of iterations ITR # are equal to the previous value or the reference value.

The calculator 21 may change the calculation speed based on the speed code SPC of a previous codeword CDWD, and may perform a calculation operation by applying the changed calculation speed to the calculation of a subsequent codeword CDWD when the subsequent codeword CDWD is input. As the calculation speed increases, power for the calculation operation may increase, whereas as the calculation speed decreases, power for the calculation operation may decrease. That is, by the speed that is set according to the speed code SPC, power consumed by the calculator 21 may vary.

When an error correction message ECM is input to the syndrome generator 23, the syndrome generator 23 may generate syndrome vectors by performing a decoding operation using a parity check matrix. A group of syndrome vectors may be referred to as a "syndrome". The syndrome generator 23 may determine that the decoding operation has failed when any UCN is present among the syndrome vectors, and may determine that the decoding operation has passed when no UCN is present among the syndrome vectors. When it is determined that the decoding operation has failed, the syndrome generator 23 may output a fail signal FSG to the calculator 21. The syndrome generator 23 may individually count the number of UCNs occurring until the decoding operation passes and the number of times (or iterations) that the calculation operation is performed until the decoding operation passes, and may then generate the UCN value UCN # and the number of iterations ITR #. When it is determined that the decoding operation has passed, the syndrome generator 23 may output an error correction message for which the syndrome check operation passes, among error correction messages generated during the iterative decoding operation, as a message MSG.

The register 24 may temporarily store the UCN value UCN # and the number of iterations ITR #, may output the UCN value UCN # and the number of iterations ITR #, both of which may be reset when the decoding operation has passed. The UCN value UCN # and the number of iterations ITR #, output from the register 24, may be input to the speed selector 22.

Figure 3:
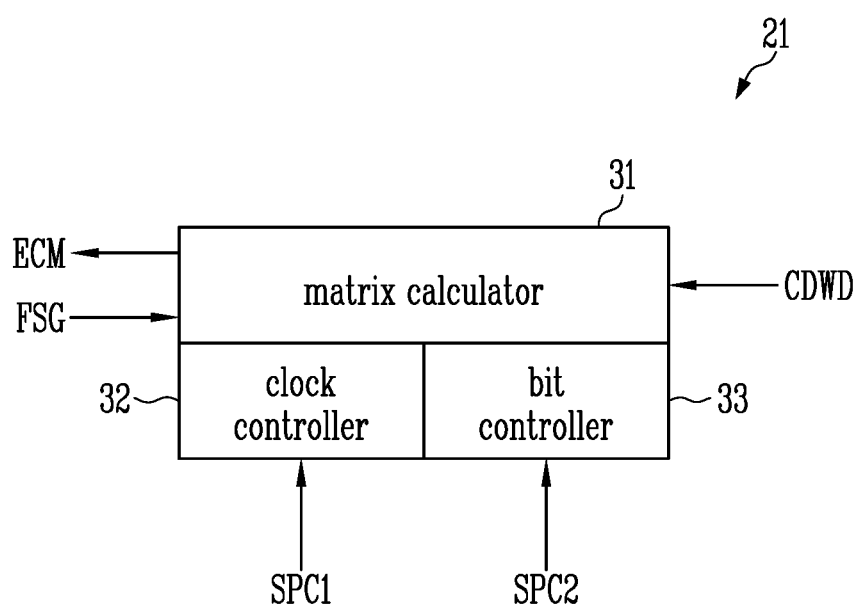
FIG. 3 is a diagram illustrating a calculator according to an embodiment of the present disclosure.

FIG. 3 is a diagram illustrating a calculator according to an embodiment of the present disclosure.

Referring to FIG. 3, the calculator 21 may include a matrix calculator 31, a clock controller 32, and a bit controller 33.

The matrix calculator 31 may perform error correction operations using a parity check matrix on a codeword CDWD, and may then generate an error correction message ECM. The matrix calculator 31 may perform error correction operations in synchronization with a clock used for system operations, and may perform error correction operations depending on the number of bits. The error correction operations performed to output an error correction message ECM may be referred to as 'cycle 1', and the error correction operations performed to output a subsequent error correction message ECM may be referred to as 'cycle 2'. When a fail signal FSG is input, the matrix calculator 31 may change a variable node VN or a bit, and may output a changed error correction message ECM by performing error correction operations.

The clock controller 32 may control a clock so that the matrix calculator 31 may sequentially perform calculation operations. An initial period may be set in the clock controller 32, but the initial period may be changed to another period in response to a first speed code SPC1. For example, the clock controller 32 may provide the clock, the period of which has changed, in response to the first speed code SPC1, to the matrix calculator 31. The matrix calculator 31 may perform an error check operation or a parity check operation in synchronization with the period of the clock.

The bit controller 33 may set the number of bits by which a calculation operation is performed in one cycle. The initial number of bits may also be set in the bit controller 33, but the number of bits by which each calculation operation is performed may be changed in response to a second speed code 2SPC.

Therefore, the speed of the calculation operation performed by the matrix calculator 31 may be changed depending on the clock set by the clock controller 32 and the number of bits set by the bit controller 33.

Figure 4:
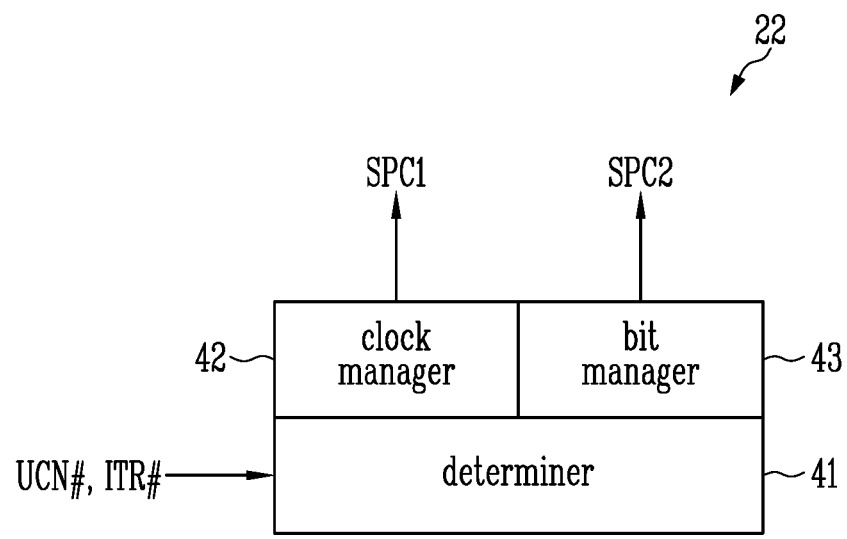
FIG. 4 is a diagram illustrating a speed selector according to an embodiment of the present disclosure.

FIG. 4 is a diagram illustrating a speed selector according to an embodiment of the present disclosure.

Referring to FIG. 4, the speed selector 22 may include a determiner 41, a clock manager 42, and a bit manager 43.

The determiner 41 may compare a UCN value UCN # and the number of iterations ITR # with respective comparative values, and may control either or both of the clock manager 42 and the bit manager 43 based on the result of the comparison. That is, UCN # may be compared with a previous UCN # or a corresponding reference value, and ITR # may be compared with a previous ITR # or a corresponding reference value. For example, the determiner 41 may output a signal, which controls a calculation speed, so that the calculation speed becomes lower than a previous speed or a reference speed when either or both of the UCN value UCN # and the number of iterations ITR # are increased from previous values or reference values, to either or both of the clock manager 42 and the bit manager 43. For example, the determiner 41 may output a signal, which controls the calculation speed, so that the calculation speed becomes higher than the previous speed or the reference speed when either or both of the UCN value UCN # and the number of iterations ITR # are decreased from previous values or reference values, to either or both of the clock manager 42 and the bit manager 43. For example, the determiner 41 may output a signal, which maintains the calculation speed at the previous speed or the reference speed when either or both of the UCN value UCN # and the number of iterations ITR # are equal to the previous values or reference values, to either or both of the clock manager 42 and the bit manager 43.

Figure 5:
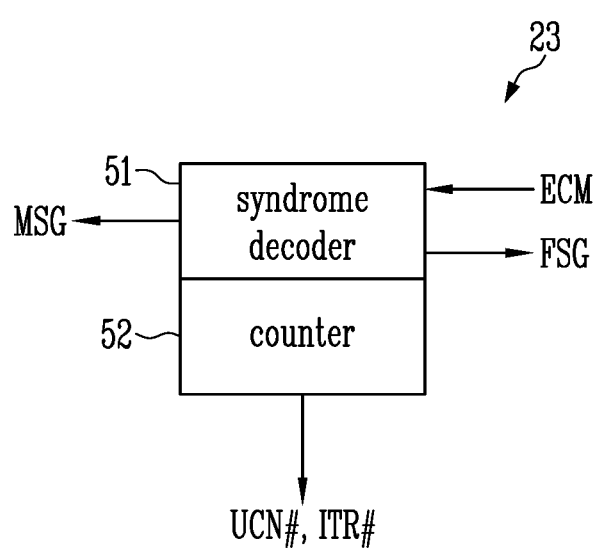
FIG. 5 is a diagram illustrating a syndrome generator according to an embodiment of the present disclosure.

FIG. 5 is a diagram illustrating a syndrome generator according to an embodiment of the present disclosure.

Referring to FIG. 5, the syndrome generator 23 may include a syndrome decoder 51 and a counter 52.

The syndrome decoder 51 may generate symbols by calculating an error correction message ECM and a parity check matrix, and may determine, based on the generated symbols, whether an error correction decoding operation has passed or failed. For example, when all symbols are '0', the syndrome decoder 51 may determine that the error correction decoding operation has passed, whereas when at least one of the symbols is '1', the syndrome decoder 51 may determine that the error correction decoding operation has failed. A group of generated symbols may be referred to as a "syndrome". When it is determined that the error correction decoding operation has passed, the syndrome decoder 51 may output a final message MSG, whereas when it is determined that the error correction decoding operation has failed, the syndrome decoder 51 may output a fail signal FSG.

The counter 52 may count the number of iterations ITR # that the decoding operation is performed by the syndrome decoder 51 and the UCN value UCN # indicating the number of bits corresponding to '1' in the syndrome vector, and output a cumulative UCN value UCN # and the number of iterations ITR #.

Figure 6:
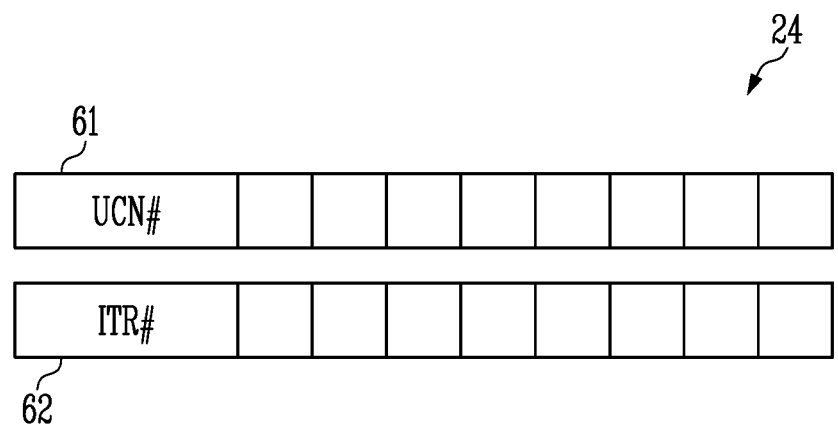
FIG. 6 is a diagram illustrating a register according to an embodiment of the present disclosure.

FIG. 6 is a diagram illustrating a register according to an embodiment of the present disclosure.

Referring to FIG. 6, the register 24 may include a plurality of storage areas 61 and 62. For example, the register 24 may be implemented as a dynamic random access memory (DRAM), a static random access memory (SRAM) or a nonvolatile memory. The register 24 may include the first storage area 61 which may store a UCN value UCN #, and the second storage area 62 which may store the number of iterations ITR #. The first storage area 61 may sequentially store the UCN value UCN # output from the syndrome generator (e.g., 23 of FIG. 5) and sequentially output the UCN value UCN #. The second storage area 62 may sequentially store the number of iterations ITR # output from the syndrome generator 23 and sequentially output the number of iterations ITR #.

Figure 7:
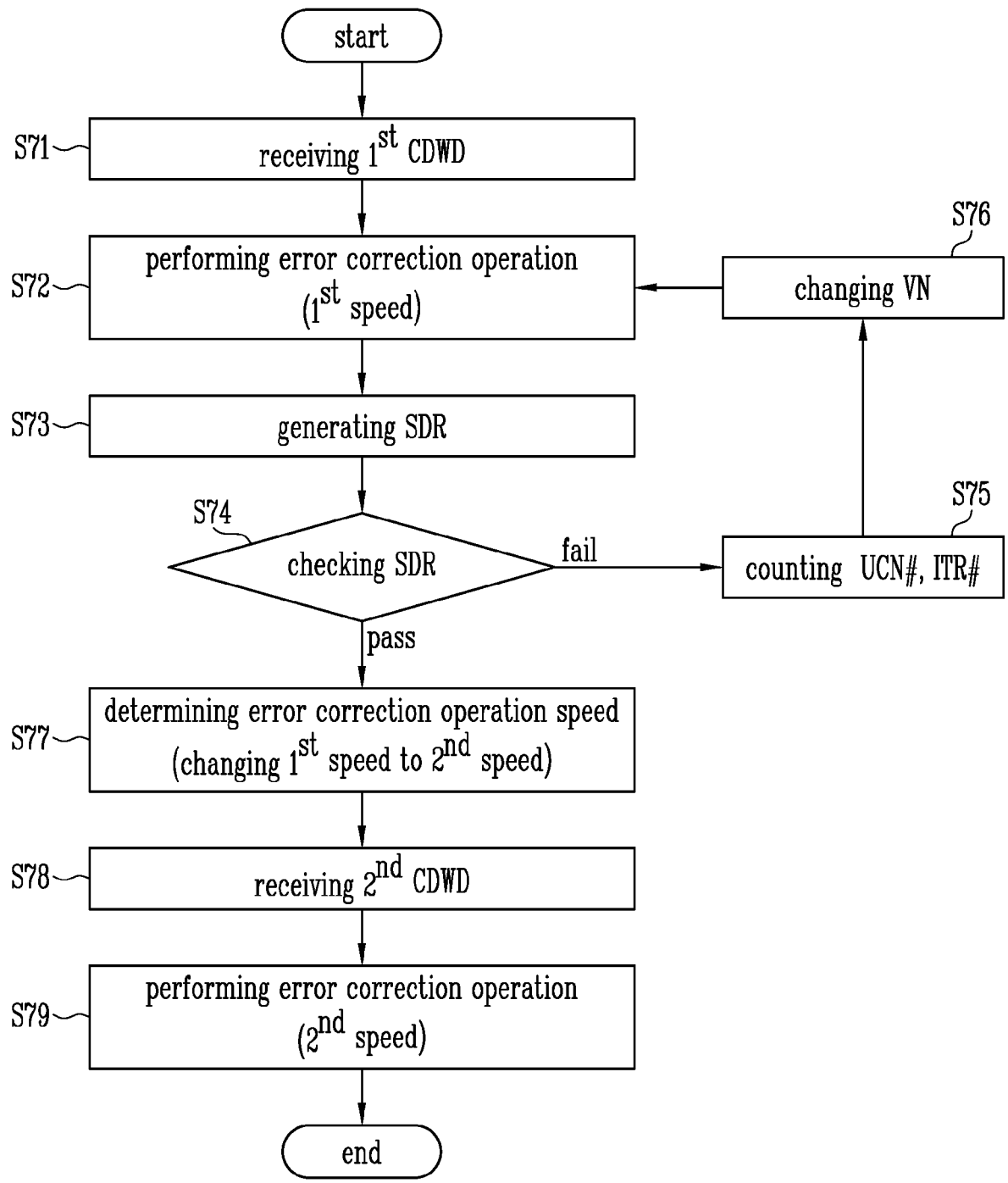
FIG. 7 is a flowchart illustrating an error correction decoding operation according to an embodiment of the present disclosure.

FIG. 7 is a flowchart illustrating an error correction decoding operation according to an embodiment of the present disclosure.

Referring to FIG. 7, when a first codeword CDWD is received at operation S71, a matrix calculator (e.g., 31 of FIG. 3) may perform an error correction operation at a first speed (1st speed), and an error correction message may be generated by the error correction operation at operation S72. The first speed may be preset.

When the error correction message is input to a syndrome decoder (e.g., 51 of FIG. 5), the syndrome decoder 51 may generate a syndrome SDR by calculating the error correction message and a parity check matrix at operation S73. Then, at operation S74, the syndrome decoder 51 may check whether any of the symbols in the syndrome SDR is not '0', and may determine that the error correction decoding operation has failed when at least one symbol is '1'. Here, when the symbol corresponding to '1' is an unsatisfied check node (UCN), the counter (e.g., 52 of FIG. 5) may count the number of UCNs UCN #, and may count the number of iterations ITR # of the error correction operations performed to generate the syndrome SDR at operation S75. When the error correction decoding operation fails and the syndrome decoder 51 outputs a fail signal FSG, the matrix calculator 31 may change a variable node VN in response to the fail signal FSG at operation S76, and may perform another iteration of the error correction operation in a set cycle at operation S72.

Until the error correction decoding operation passes at operation S74, operations S72 to S76 may be iterated up to a maximum iteration number, and if the error correction decoding operation still has not passed after having been performed the maximum number of times allowable, the error correction of S72 may be deemed a fail.

At operation S74, when all symbols in the syndrome are '0', the syndrome decoder 51 may determine that the error correction decoding operation has passed, and the counter 52 may output the cumulative UCN value UCN # and the number of iterations ITR #.

The determiner 41 may determine the speed of the error correction operation depending on either or both of the UCN value UCN # and the number of iterations ITR # at operation S77. The determiner 41 may respectively compare the UCN value UCN # and the number of iterations ITR # with previous values or reference values, and may control either or both of a clock manager (e.g., 42 of FIG. 4) and a bit manager (e.g., 43 of FIG. 4) based on the result of the comparison, thus changing the conditions influencing the speed of the error correction operation.

For example, the determiner 41 may output a signal, which controls a calculation speed so that the calculation speed becomes lower than a previous speed or a reference speed when either or both of the UCN value UCN # and the number of iterations ITR # are increased from previous values or reference values, to either or both of the clock manager 42 and the bit manager 43. For example, the determiner 41 may output a signal, which controls the calculation speed so that the calculation speed becomes higher than the previous speed or the reference speed when either or both of the UCN value UCN # and the number of iterations ITR # are decreased from previous values or reference values, to either or both of the clock manager 42 and the bit manager 43. For example, the determiner 41 may output a signal, which maintains the calculation speed at the previous speed or the reference speed when either or both of the UCN value UCN # and the number of iterations ITR # are equal to the previous values or reference values, to either or both of the clock manager 42 and the bit manager 43.

The clock manager 42 and the bit manager 43 may output signals under the control of the determiner 41, and the clock controller (e.g., 32 of FIG. 3) and the bit controller (e.g., 33 of FIG. 3) may change the conditions related to the speed of the error correction operation depending on the signals output from the clock manager 42 and the bit manager 43. The clock controller 32 may control the period of the clock at which the error correction operation is performed, and the bit controller 33 may control the number of bits used in the matrix calculator 31. For example, when an error correction operation on a first codeword CDWD is performed at a first speed, the conditions may be set such that an error correction operation on a subsequent codeword is performed at a second speed different from the first speed.

When the setting of the speed of the error correction operation is completed at operation S77, the matrix calculator 31 may receive a second codeword CDWD at operation S78, and may perform an error correction operation at the second speed at operation S79.

The above-described error correction operation and error correction decoding operation is described in detail below.

Figures 8, 9:
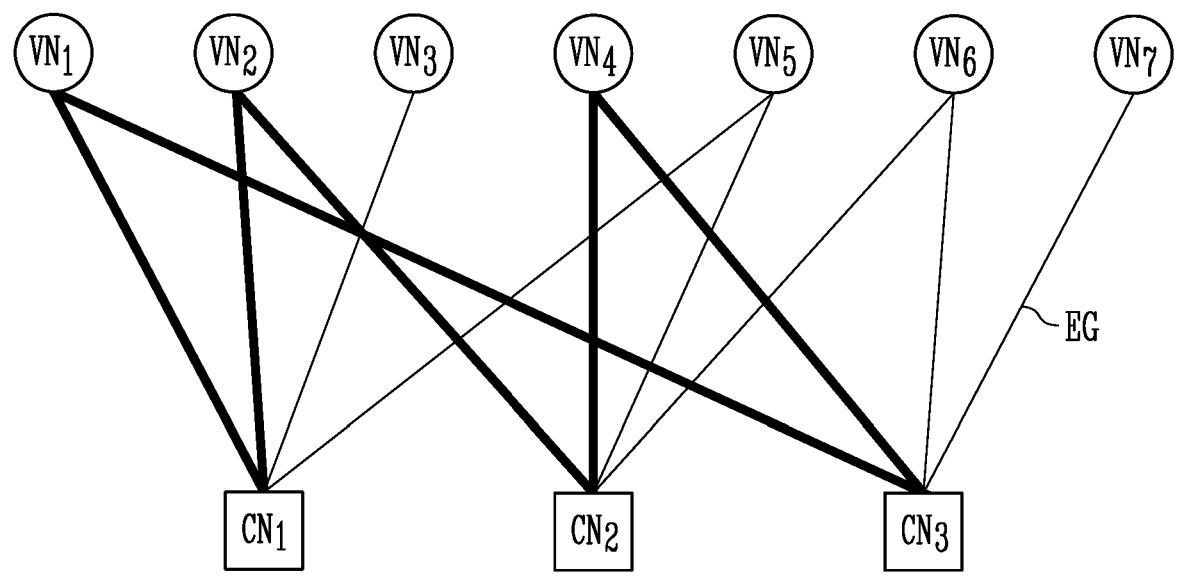
FIG. 8 is a diagram illustrating a parity check matrix according to an embodiment of the present disclosure.
FIG. 9 is a diagram illustrating a Tanner graph that corresponds to the parity check matrix of FIG. 8.

FIG. 8 is a diagram illustrating a parity check matrix according to an embodiment of the present disclosure.

In FIG. 8, an example of a parity check matrix H defining an (n, k) code is illustrated.

The (n, k) code may be defined as a matrix having a size of (n−k)×n. Each entry of the parity check matrix H is one of two values, e.g., '0' or '1'. In the parity check matrix H, the number of 1s is less than the number of 0s. The (n, k) code may be referred to as an '(n, k) LDPC code'. Here, n and k may be positive integers. In FIG. 8, as an example, a parity check matrix H defining a (7, 4) code is illustrated.

FIG. 9 is a diagram illustrating a Tanner graph that corresponds to the parity check matrix of FIG. 8.

Referring to FIG. 9, an (n, k) code may be represented by a Tanner graph which has the form of an equivalent bipartite graph. The Tanner graph may be represented by n−k check nodes, n variable nodes, and edges. In the Tanner graph illustrated in FIG. 9, three check nodes $CN_1$ to $CN_3$, seven variable nodes $VN_1$ to $VN_7$, and a plurality of edges EG are included.

The check nodes $CN_1$ to $CN_3$ may correspond to the columns of the parity check matrix H illustrated in FIG. 8, and the variable nodes $VN_1$ to $VN_7$ may correspond to rows of the parity check matrix. Each of the edges EG denotes a coupling of one check node to one variable node.

An iterative decoding operation may be performed based on an iterative message passing algorithm between the check nodes $CN_1$ to $CN_3$ and the variable nodes $VN_1$ to $VN_7$. That is, in each iteration, the iterative decoding operation may be performed while error correction messages are transferred between the check nodes $CN_1$ to $CN_3$ and the variable nodes $VN_1$ to $VN_7$.

Each of the variable nodes $VN_1$ to $VN_7$ may perform an error correction operation using check-node-to-variable-node (C2V) messages received from check nodes coupled thereto, and may generate variable-node-to-check-node (V2C) messages to be sent to the check nodes $CN_1$ to $CN_3$ coupled thereto. Each of the variable nodes $VN_1$ to $VN_7$ may send V2C messages to the check nodes $CN_1$ to $CN_3$ coupled thereto.

Each of the check nodes $CN_1$ to $CN_3$ may perform a parity check operation using V2C messages received from the variable nodes $VN_1$ to $VN_7$ coupled thereto, and may generate C2V messages to be sent to the variable nodes $VN_1$ to $VN_7$ coupled thereto. Each of the check nodes $CN_1$ to $CN_3$ may send C2V messages to the variable nodes $VN_1$ to $VN_7$ coupled thereto.

A cycle may be a path (indicated by bold lines in FIG. 9) through which a message from one node passes through edges EG and then returns to the node itself. For example, each message sending path between select variable nodes (among $VN_1$ to $VN_7$) and select check nodes (among $CN_1$ to $CN_3$) may be referred to as a 'cycle'.

FIG. 10 is a diagram illustrating a method of generating symbols using the parity check matrix illustrated in FIG. 8, and FIG. 11 is a diagram illustrating symbols and unsatisfied check nodes (UCN) according to an embodiment of the present disclosure.

Referring to FIGS. 10 and 11, symbols $S_{i1}$ to $S_{i3}$ may be generated based on a parity check matrix (H of FIG. 8) and a transposed matrix $C_i^T$ of variable node vectors $C_{i1}$ to $C_{i7}$ corresponding to an i-th iteration.

When all of the symbols $S_{i2}$, $S_{i2}$, and $S_{i3}$ are '0', the syndrome check operation has passed, and also means that error correction decoding has succeeded in the corresponding iteration. Therefore, the iterative decoding operation on the codeword may be terminated, and the variable node vectors $C_{i1}$ to $C_{i7}$ corresponding to the i-th iteration may be output as a message MSG.

When at least one of the symbols $S_{i1}$, $S_{i2}$, and $S_{i3}$ of the syndrome SDR is not '0', the syndrome check operation has failed. Since this means that error correction decoding has failed in the corresponding iteration, a subsequent iterative decoding operation may be performed unless the current iteration has reached the maximum iteration number. Here, the symbol other than '0' denotes an UCN. For example, when two '1' symbols are present among the symbols in the syndrome, the UCN value UCN # may be 2. When one '1' symbol is present in a subsequently generated syndrome, the UCN value UCN # is 1, and thus the cumulative UCN value UCN # may be 3.

Figure 12:
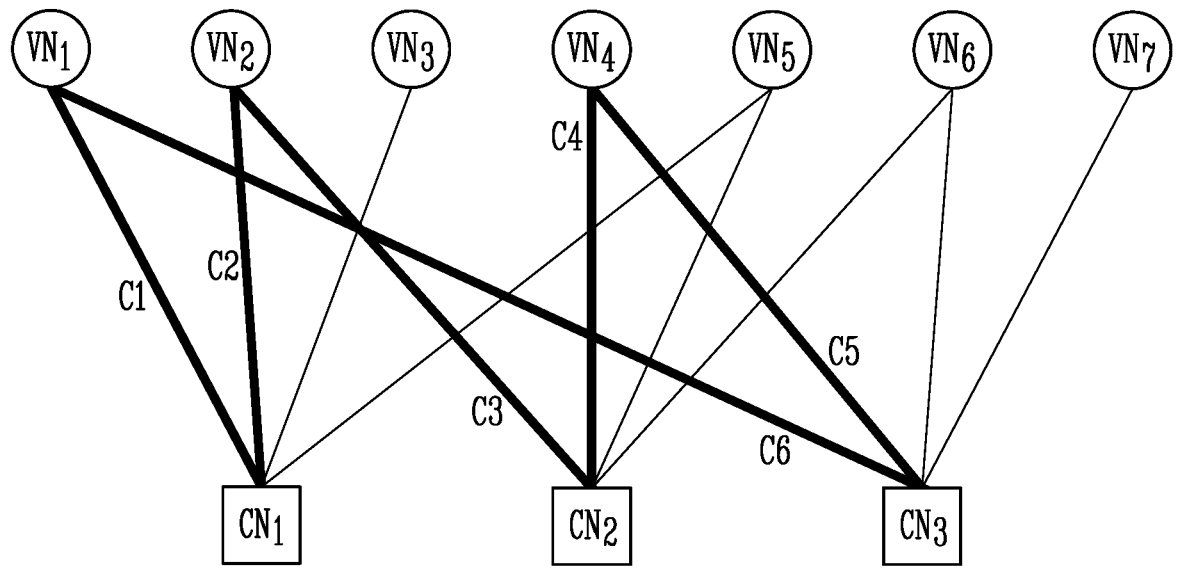
FIGS. 12 and 13 are diagrams illustrating a method of controlling the speed of an error correction decoding operation according to an embodiment of the present disclosure.
Figure 13:
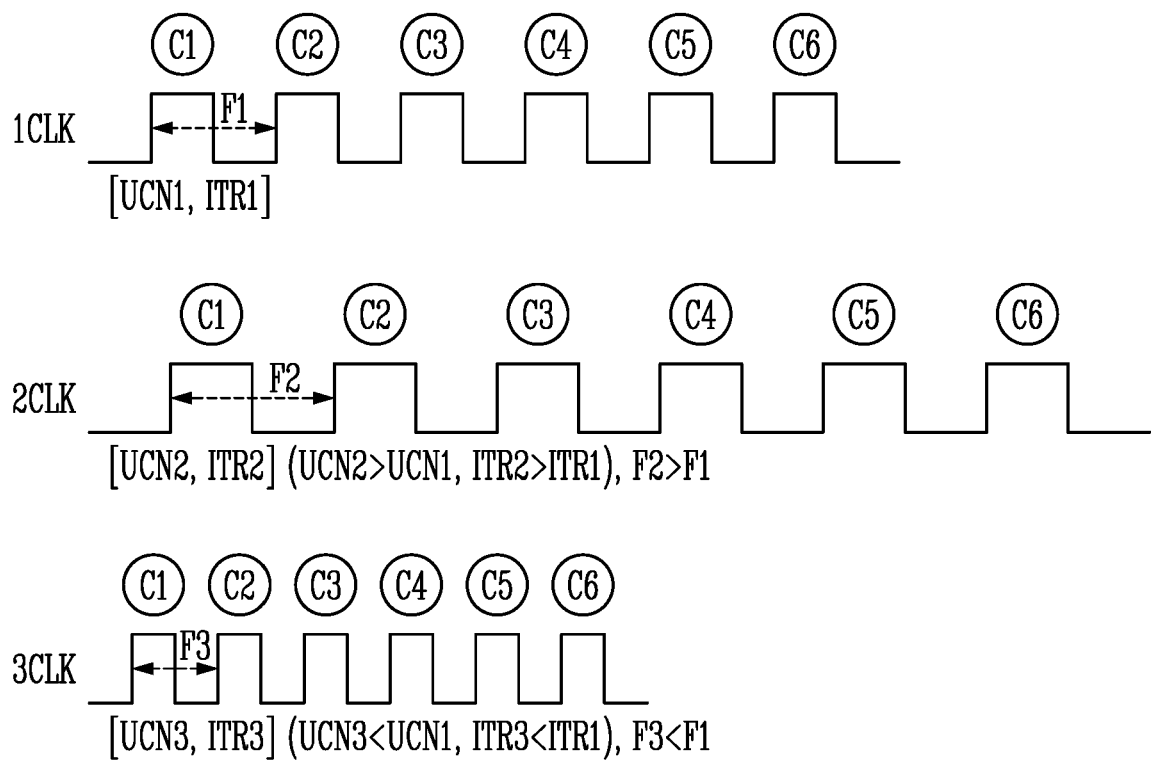

FIGS. 12 and 13 are diagrams illustrating a method of controlling the speed of an error correction decoding operation according to an embodiment of the present disclosure.

Referring to FIG. 12, in an embodiment, the period of a clock at which an iterative decoding operation is performed may be controlled. For example, when a first variable node $VN_1$ sends an error correction message to a first check node $CN_1$, a first calculation C1 may be performed, whereas when the first check node $CN_1$ sends an error correction message to a second variable node $VN_2$, a second calculation C2 may be performed. In this sequence, when the first to sixth calculations C1 to C6 are sequentially performed within one cycle, the first to sixth calculations C1 to C6 may be sequentially performed in synchronization with a clock CLK.

Referring to FIG. 13, when a first clock 1CLK, a first UCN value UCN1, and the first number of iterations ITR1 are set as reference values, the first to sixth calculations C1 to C6 performed during the first iterative decoding operation may be sequentially performed in synchronization with the first clock 1CLK.

For example, when the UCN value UCN # and the number of iterations ITR # are detected as a second UCN value UCN2 and the second number of iterations ITR2, which are respectively greater than the first UCN value UCN1 and the first number of iterations ITR1, as a result of the iterative decoding operation on a first codeword, it means that the number of detected errors is greater than the reference number of errors. In this case, in order to improve the reliability of an iterative decoding operation on a second codeword to be input subsequent to the first codeword and reduce power consumption, a second clock 2CLK having a second period F2 longer than the first period F1 of the first clock 1CLK may be set. Therefore, the iterative decoding operation on the second codeword may be performed slower than the previous iterative decoding operation in synchronization with the second clock 2CLK.

When the UCN value UCN # and the number of iterations ITR # are detected as a third UCN value UCN3 and the third number of iterations ITR3, which are respectively less than the first UCN value UCN1 and the first number of iterations ITR1, as a result of the iterative decoding operation on the first codeword, it means that the number of detected errors is less than the reference number of errors. In this case, in order to increase the operation speed of the iterative decoding operation on the second codeword to be input subsequent to the first codeword from the previous operation speed, a third clock 3CLK having a third period F3 shorter than the first period F1 of the first clock 1CLK may be set. Therefore, the iterative decoding operation on the second codeword may be performed faster than the previous iterative decoding operation in synchronization with the third clock 3CLK.

Figure 14:
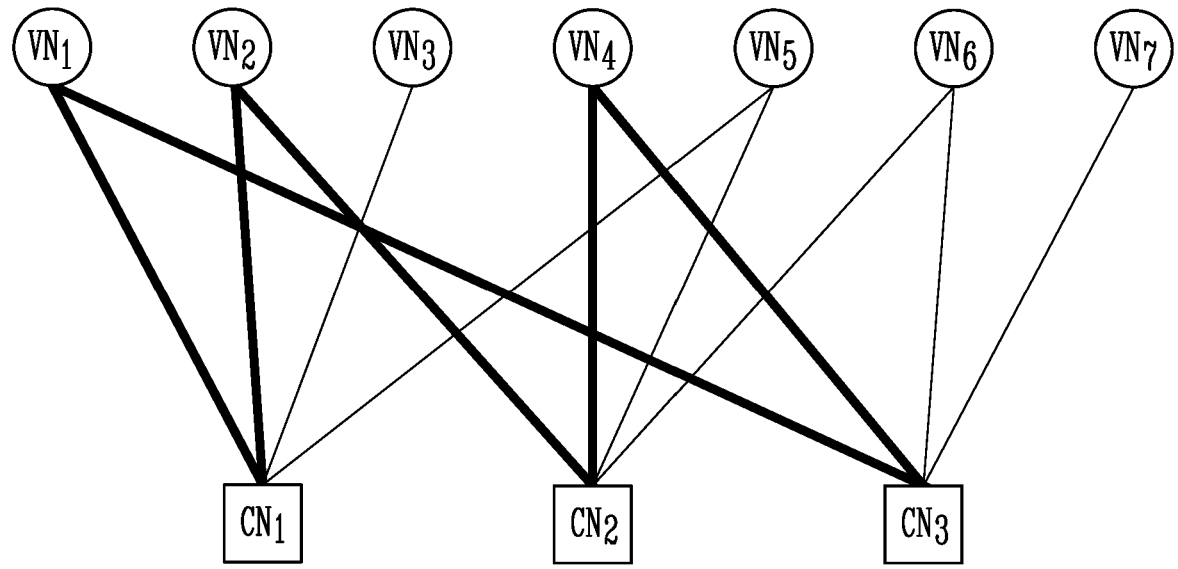
FIGS. 14 and 15 are diagrams illustrating a method of controlling the speed of an error correction decoding operation according to an embodiment of the present disclosure.
Figure 15:
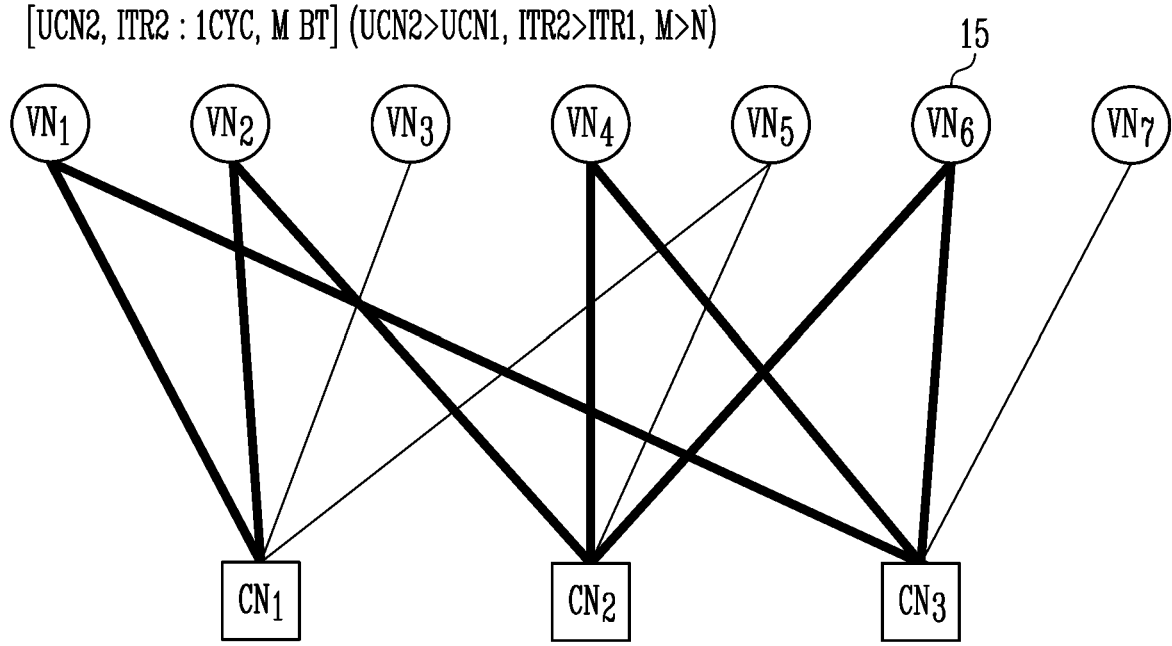

FIGS. 14 and 15 are diagrams illustrating a method of controlling the speed of an error correction decoding operation according to an embodiment of the present disclosure.

Referring to FIGS. 14 and 15, when the UCN value UCN # and the number of iterations ITR # are increased, the number of bits to be processed in each calculation of the iterative decoding operation may be increased. For example, it is assumed that, during an iterative decoding operation on a first codeword, the number of bits to be processed per cycle (1CYC) is N. In an embodiment illustrated in FIG. 14, N is 3, but this is only an example; N may be changed to other values.

In an embodiment illustrated in FIG. 14, in a case where the number of bits to be processed in one cycle (1CYC) is 3 ($VN_1$, $VN_2$, and $VN_4$), when the UCN value UCN # and the number of iterations ITR # are detected as a second UCN value UCN2 and the second number of iterations ITR2, which are greater than the first UCN value UCN1 and the first number of iterations ITR1, as a result of the iterative decoding operation on the first codeword, bit 15 may be added to enable M bits (where M is a positive integer greater than N) to be processed per cycle (1CYC) during the iterative decoding operation to be performed on a second codeword that is input subsequent to the first codeword.

Figure 16:
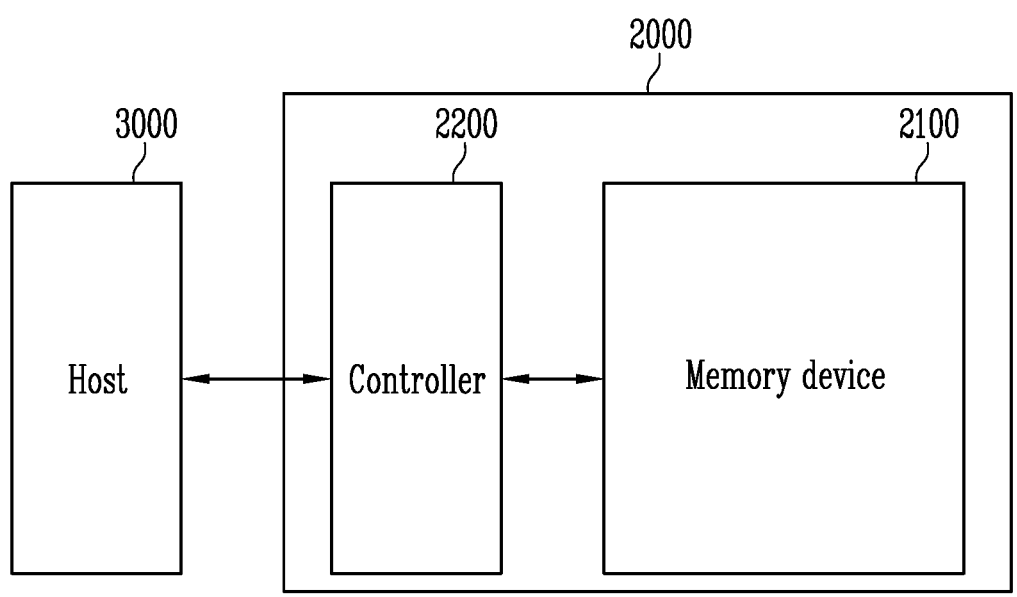
FIG. 16 is a diagram illustrating a memory system according to an embodiment of the present disclosure.

FIG. 16 is a diagram illustrating a memory system according to an embodiment of the present disclosure.

Referring to FIG. 16, a memory system 2000 may include a memory device 2100 which stores data, and a controller 2200 which performs communication between the memory device 2100 and a host 3000.

The memory device 2100 may include a plurality of memory blocks which may store data, and each of the memory blocks may include volatile memory cells or non-volatile memory cells. The memory device 2100 may communicate with the controller 2200 through a channel. For example, the memory device 2100 may perform various operations in response to commands output from the controller 2200. For example, during a program operation, the memory device 2100 may receive a program command and a codeword which are output from the controller 2200, and may store the codeword in a selected memory block in response to the program command. Further, the memory device 2100 may output data (e.g., a codeword), read from a selected memory block, to the controller 2200 in response to a read command and an address which are output from the controller 2200.

The controller 2200 may perform communication between the host 3000 and the memory device 2100. The controller 2200 may control the memory device 2100 in response to a request from the host 3000, or may perform a background operation for improving the performance of the memory system 2000 without a request from the host 3000.

The host 3000 may generate requests for various operations, and may output the generated requests to the memory system 2000. For example, the requests may include a program request for controlling a program operation, a read request for controlling a read operation, an erase request for controlling an erase operation, etc. The host 3000 may communicate with the memory system 2000 through any of various interfaces, such as Peripheral Component Interconnect Express (PCIe), Advanced Technology Attachment (ATA), Serial ATA (SATA), Parallel ATA (PATA), serial attached small computer system interface (SCSI) (SAS), Non-Volatile Memory Express (NVMe), Universal Serial Bus (USB), Multi-Media Card (MMC), Enhanced Small Disk Interface (ESDI), or Integrated Drive Electronics (IDE).

Figure 17:
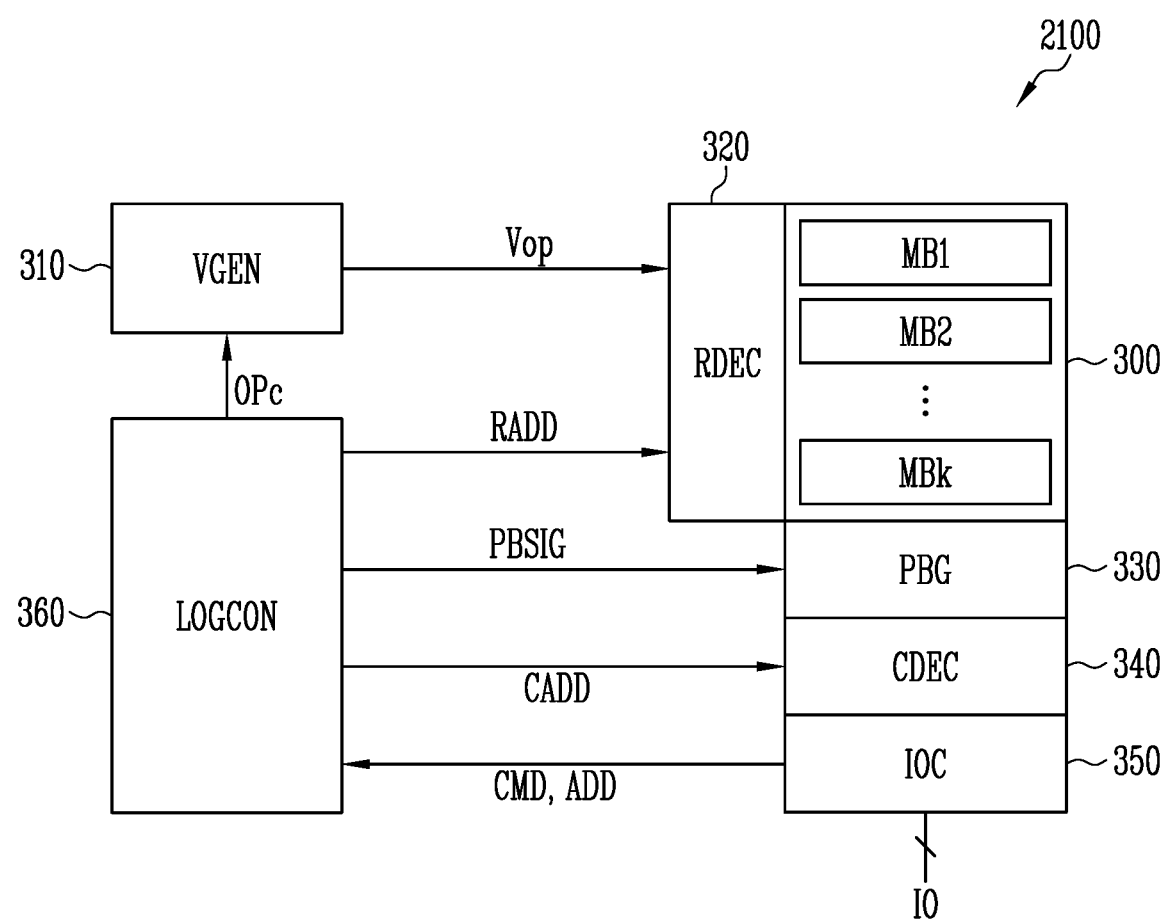
FIG. 17 is a diagram illustrating a memory device, such as that of FIG. 16.

FIG. 17 is a diagram illustrating the memory device of FIG. 16.

Referring to FIG. 17, the memory device 2100 may include a memory cell array 300 which stores data, a peripheral circuit (collectively, elements 310 to 350) which perform a program operation, a read operation or an erase operation, and a control logic circuit (LOGCON) 370 which controls the peripheral circuit. The peripheral circuit may include a voltage generator (VGEN) 310, a row decoder (RDEC) 320, a page buffer group (PBG) 330, a column decoder (CDEC) 340, and an input/output circuit (IOC) 350.

The memory cell array 300 may include a plurality of memory blocks MB1 to MBk (where k is a positive integer) in which data is stored. Each of the memory blocks MB1 to MBk may include a plurality of memory cells, which may be implemented in a two-dimensional (2D) structure in which memory cells are horizontally arranged on a substrate, or in a three-dimensional (3D) structure in which memory cells are vertically stacked on a substrate.

The voltage generator 310 may generate and output operating voltages Vop for various operations in response to an operation code OPc. For example, the voltage generator 310 may generate and output a program voltage, a verify voltage, a read voltage, a pass voltage, an erase voltage, and the like. During the program operation, the voltage generator 310 may control the levels of the program voltage and the verify voltage in response to the operation code OPc.

The row decoder 320 may select one memory block from among the memory blocks included in the memory cell array 300 in response to a row address RADD, transfer operating voltages Vop, and may transmit the operating voltages Vop to the selected memory block.

The page buffer group 330 may be coupled to the memory cell array 300 through bit lines. For example, the page buffer group 330 may include page buffers coupled to respective bit lines. The page buffers may be simultaneously operated in response to page buffer control signals PBSIG, and may temporarily store data during a program or read operation. For this operation, each of the page buffers may include a plurality of latches which temporarily store data. The number of latches may vary according to a program scheme. Also, the page buffers may be designed differently according to the number of bits that can be stored in one memory cell or according to the number of verify voltages that are used in the verify operation. Further, the verify voltages may be used to determine various threshold voltages of memory cells to be programmed to the same target voltage.

The column decoder 340 may sequentially transfer data between the input/output circuit 350 and the page buffer group 330 in response to a column address CADD.

The input/output circuit 350 may be coupled to the controller 2200 through input/output lines IO. The input/output circuit 350 may receive/output a command CMD, an address ADD, and data DATA through the input/output lines IO. For example, the input/output circuit 350 may transmit the command CMD and the address ADD, received through the input/output lines IO, to the control logic circuit 360, and may transmit the data, received through the input/output lines IO, to the page buffer group 330. The input/output circuit 350 may output the data, received from the page buffer group 330, to the controller 2200 through the input/output lines IO.

The control logic circuit 360 may output the operation code OPc, the row address RADD, the page buffer control signals PBSIG, and the column address CADD in response to the command CMD and the address ADD. For example, the control logic circuit 360 may include software such as an algorithm that is executed in response to the command CMD, and may include hardware which outputs various types of codes and signals depending on the algorithm employed.

Figure 18:
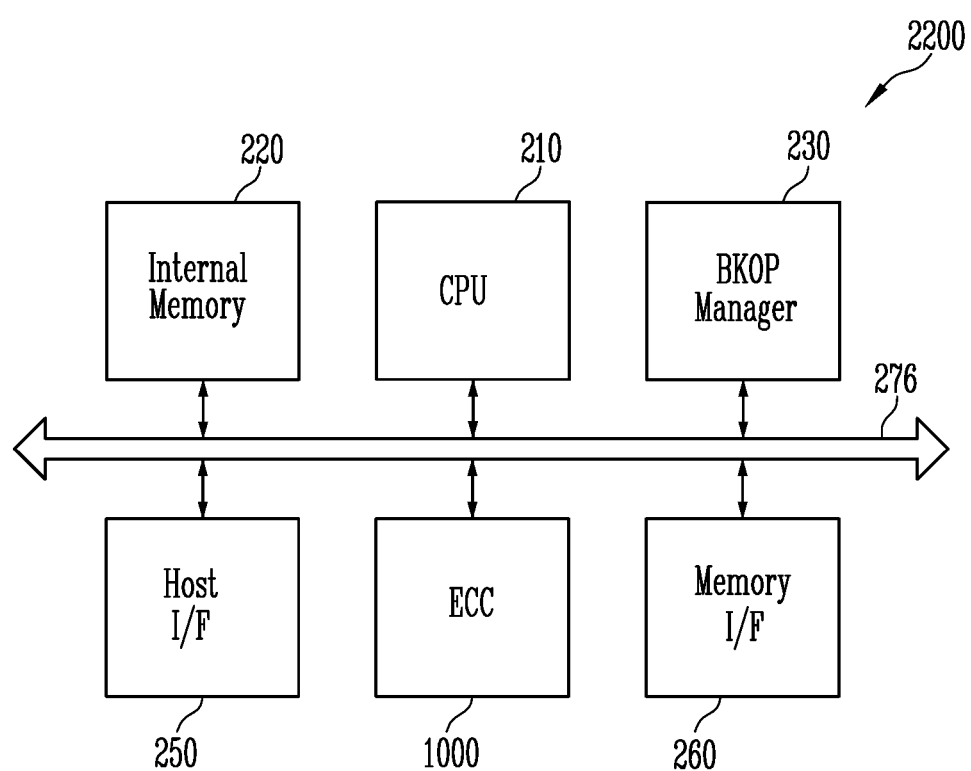
FIG. 18 is a diagram illustrating a controller, such as that of FIG. 16.

FIG. 18 is a diagram illustrating the controller of FIG. 16.

Referring to FIG. 18, the controller 2200 may include a central processing unit (CPU) 210, an internal memory 220, a background operation manager (BKOP manager) 230, an error correction circuit (ECC) 1000, a host interface (host I/F) 250, and a memory interface (memory I/F) 260, which communicate with each other through a bus 276.

The CPU 210 may control the memory device (e.g., 2100 of FIG. 16) in response to a request RQ from the host (e.g., 3000 of FIG. 16). For example, when the request RQ is received from the host 3000, the CPU 210 may generate a command set by combining a command, such as a program, read or erase command for controlling the memory device 2100, with an address in response to the received request. When a request is not received from the host 300, the CPU 210 may autonomously perform a background operation by controlling the background operation manager 230 so as to improve the performance of the memory system (e.g., 2000 of FIG. 16).

The internal memory 220 may temporarily store various types of data for the operation of the controller 2200, or may temporarily store data during a program or read operation. For example, the internal memory 220 may be implemented as a DRAM, an SRAM or a nonvolatile memory. The internal memory 220 may store various addresses for the operation of the memory system 2000, and may store and update various types of state information of memory blocks corresponding to respective addresses. For example, the internal memory 220 may store a mapping table in which logical addresses are mapped to physical addresses, and may output a selected address in response to a request from the CPU 210.

The background operation manager 230 may output a command for a background operation, such as garbage collection or wear leveling, in response to the request from the CPU 210.

The error correction circuit 1000 may be configured, as illustrated in FIG. 1, and may perform an error correction operation, such as that in the above-described embodiments. For example, the error correction circuit 1000 may output a codeword by encoding data (e.g., a message) received from the host 3000 during a program operation, and may output a message by decoding data (e.g., a codeword) received from the memory device 2100 during a read operation. During encoding and decoding, a low-density parity check (LDPC) code may be used. Alternatively, an error correction operation may be performed using any of various other types of codes, e.g., a non LDPC code.

The host interface 250 may exchange commands, addresses, data, etc. between the controller 2200 and the host 3000. For example, the host interface 250 may be implemented with any of various interfaces, such as Peripheral Component Interconnect Express (PCIe), Advanced Technology Attachment (ATA), Serial ATA (SATA), Parallel ATA (PATA), serial attached SCSI (SAS), Non-Volatile Memory Express (NVMe), Universal Serial Bus (USB), Multi-Media Card (MMC), Enhanced Small Disk Interface (ESDI), or Integrated Drive Electronics (IDE).

The memory interface 260 may exchange commands, addresses, data, and the like between the controller 2200 and the memory device 2100. For example, the memory interface 260 may communicate with the memory device 2100 through channels.

Embodiments of the present disclosure may control the speed of an error correction decoding operation to be performed on a subsequent codeword based on the result of a previous error correction decoding operation.

What is claimed is:

1. An error correction decoder, comprising:
   a calculator configured to output an error correction message by performing an iterative decoding operation on a first codeword;
   a syndrome generator configured to generate a syndrome by calculating the error correction message and a parity check matrix and to output a number of iterations representing the number of times the iterative decoding operation has been performed, and an unsatisfied check node (UCN) value representing the number of unsatisfied check nodes in the syndrome; and
   a speed selector configured to output a speed code for controlling a speed of the iterative decoding operation depending on the number of iterations and the UCN value,
   wherein the calculator changes the speed of the iterative decoding operation based on the speed code and performs the iterative decoding operation at the changed speed when a second codeword is input.

2. The error correction decoder according to claim 1, wherein the calculator comprises:

a matrix calculator configured to perform the iterative decoding operation including a plurality of calculation operations using the first codeword and the parity check matrix;

a clock controller configured to control a clock at which the iterative decoding operation is to be performed in response to a first speed code included in the speed code; and a bit controller configured to control a number of bits to be processed per cycle of the iterative decoding operation in response to a second speed code included in the speed code.

3. The error correction decoder according to claim 1, wherein the syndrome generator comprises:

a syndrome decoder configured to generate the syndrome by calculating the error correction message and the parity check matrix, output a message when no unsatisfied check node is detected in the syndrome, and output a fail signal when at least one unsatisfied check node is detected in the syndrome; and a counter configured to count the number of unsatisfied check nodes and the number of times the iterative decoding operation has been performed to generate the UCN value and the number of iterations when the fail signal is output during the iterations, and to output the UCN value and the number of iterations when the message is output.

4. The error correction decoder according to claim 3, wherein the UCN value represents the number of unsatisfied check nodes detected in the syndrome.

5. The error correction decoder according to claim 3, wherein:

the syndrome decoder transmits the fail signal to the calculator, and the calculator performs another iteration of the iterative decoding operation in response to the fail signal.

6. The error correction decoder according to claim 2, wherein the speed selector comprises:

a determiner configured to compare the number of iterations of the iterative decoding operation with a comparative iterations value and to compare the UCN value with a comparative UCN value;

a clock manager configured to output the first speed code for changing a period of a clock for the iterative decoding operation under control of the determiner; and a bit manager configured to output the second speed code for changing the number of bits to be processed per cycle of the iterative decoding operation under control of the determiner, wherein the comparative iterations value represents a previous iteration value or a reference iteration value, and the comparative UCN value represents a previous UCN value or a reference UCN value.

7. The error correction decoder according to claim 6, wherein the clock manager is configured to, when the number of iterations and the UCN value are greater than the comparative iterations value and the comparative UCN value respectively, output the first and second speed codes so that the speed of the iterative decoding operation becomes lower than a previous speed of the iterative decoding operation.

8. The error correction decoder according to claim 7, wherein:

the first speed code configured such that the speed of the iterative decoding operation becomes lower than the previous speed includes a code for increasing the period of the clock, and the second speed code configured such that the speed of the iterative decoding operation becomes lower than the previous speed includes a code for increasing the number of bits to be processed per cycle.

9. The error correction decoder according to claim 6, wherein the clock manager is configured to, when the number of iterations and the UCN value are less than the comparative iterations value and the comparative UCN value respectively, output the first and second speed codes so that the speed of the iterative decoding operation becomes higher than a previous speed of the iterative decoding operation.

10. The error correction decoder according to claim 9, wherein:

the first speed code configured such that the speed of the iterative decoding operation becomes higher than the previous speed includes a code for decreasing the period of the clock, and the second speed code configured such that the speed of the iterative decoding operation becomes higher than the previous speed includes a code for decreasing the number of bits to be processed per cycle.

11. An error correction circuit, comprising:

an error correction encoder configured to generate a codeword by encoding a message received from a host, and transmit the codeword to a memory device; and an error correction decoder configured to receive the codeword from the memory device, output the message by performing a decoding operation on the codeword, obtain a number of iterations representing the number of times an iterative decoding operation has been performed on the codeword and an unsatisfied check node (UCN) value from the decoding operation, and control a speed of the decoding operation on a subsequent codeword using the number of iterations and the UCN value.

12. The error correction circuit according to claim 11, wherein the decoding operation performed by the error correction decoder comprises the iterative decoding operation and a syndrome check operation.

13. The error correction circuit according to claim 12, wherein the error correction decoder comprises:

an iteration calculator configured to perform the iterative decoding operation; and a syndrome checker configured to perform the syndrome check operation.

14. The error correction circuit according to claim 13, wherein the iteration calculator comprises:

a calculator configured to output an error correction message by performing the iterative decoding operation, and a speed selector configured to output a speed code for controlling a speed of the iterative decoding operation, and wherein the syndrome checker comprises:

a syndrome generator configured to generate a syndrome depending on the error correction message and output the message when UCN is not present among symbols in the syndrome and output a fail signal when at least one UCN is present among the symbols, and a register configured to store and output the UCN value representing a number of UCNs counted by the syndrome generator and the number of iterations.

15. The error correction circuit according to claim 14, wherein the calculator comprises:
   a matrix calculator configured to perform the iterative decoding operation using a first codeword and a parity check matrix and output the error correction message as a result of the iterative decoding operation;
   a clock controller configured to control a clock at which the iterative decoding operation is to be performed in response to a first speed code included in the speed code; and
   a bit controller configured to control a number of bits to be processed per cycle of the iterative decoding operation in response to a second speed code included in the speed code.

16. The error correction circuit according to claim 15, wherein the speed selector comprises:
   a determiner configured to compare the number of iterations with a comparative iterations value and to compare the UCN value with a comparative UCN value;
   a clock manager configured to output the first speed code for changing a period of the clock under control of the determiner; and
   a bit manager configured to output the second speed code for changing the number of bits to be processed per cycle of the iterative decoding operation under control of the determiner,
   wherein the comparative iterations value represents a previous iteration value or a reference iteration value, and the comparative UCN value represents a previous UCN value or a reference UCN value.

17. The error correction circuit according to claim 14, wherein the syndrome generator comprises:
   a syndrome decoder configured to generate the syndrome by calculating the error correction message and a parity check matrix, output the message when the UCN is not detected in the syndrome, and output the fail signal when the UCN is detected in the syndrome; and
   a counter configured to count the UCNs to generate the UCN value and to count the number of iterations when the fail signal is output during the iterations, and to output the UCN value and the number of iterations when the message is output.

18. The error correction circuit according to claim 14, wherein the register is configured to:
   sequentially store and output the UCN value and the number of iterations, and
   be reset when the message is output.

19. The error correction circuit according to claim 11, wherein the error correction decoder is configured to:
   when the number of error bits is greater than a previous value or a reference value as a result of the decoding operation on a previous codeword, control the speed of the decoding operation on the subsequent codeword so that the speed of the decoding operation on the subsequent codeword becomes lower than a previous speed of the decoding operation on the previous codeword or a reference speed, and
   when the number of error bits is less than the previous value or the reference value as a result of the decoding operation on the previous codeword, control the speed of the decoding operation on the subsequent codeword so that the speed of the decoding operation on the subsequent codeword becomes higher than the previous speed or the reference speed.

20. A method of operating an error correction decoder, comprising:
   outputting an error correction message by performing an iterative decoding operation using a first codeword and a parity check matrix;
   generating a syndrome by calculating the error correction message and the parity check matrix;
   checking whether an unsatisfied check node (UCN) is present in the syndrome;
   when the UCN is present in the syndrome, counting the number of UCNs to generate a UCN value and counting the number of iterations corresponding to the number of times that the iterative decoding operation has been performed;
   changing a speed of the iterative decoding operation depending on the counted UCN value and the counted number of iterations;
   when no UCN is present in the syndrome, outputting, as a message, values of a transposed matrix used to generate the syndrome; and
   performing the iterative decoding operation using a second codeword and the parity check matrix at the changed speed.

* * * * *